(12) United States Patent
Choi et al.

(10) Patent No.: US 10,811,490 B2
(45) Date of Patent: Oct. 20, 2020

(54) ELECTROLUMINESCENT DISPLAY DEVICE

(71) Applicant: LG DISPLAY CO., LTD., Seoul (KR)

(72) Inventors: Jeongmook Choi, Paju-si (KR); Nackyoun Jung, Paju-si (KR); Sangbin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/201,700

(22) Filed: Nov. 27, 2018

(65) Prior Publication Data
US 2019/0165085 A1    May 30, 2019

(30) Foreign Application Priority Data
Nov. 30, 2017 (KR) .................. 10-2017-0162464

(51) Int. Cl.
*H01L 27/32* (2006.01)
*H01L 51/52* (2006.01)
*H01L 51/00* (2006.01)

(52) U.S. Cl.
CPC ...... *H01L 27/3279* (2013.01); *H01L 27/3223* (2013.01); *H01L 51/5228* (2013.01);
(Continued)

(58) Field of Classification Search
CPC . H01L 27/32; H01L 27/3244; H01L 27/3246; H01L 27/3248; H01L 27/3262; H01L 27/3276; H01L 27/3279; H01L 27/3223; H01L 51/445; H01L 51/50; H01L 51/5012; H01L 51/5203; H01L 51/5212; H01L 51/5225; H01L 51/5228; H01L 51/5271; H01L 51/0005; H01L 2251/5315; H01L 2251/558; H01L 2251/5338; H01L 2251/568; H01L 2227/32
(Continued)

(56) References Cited

U.S. PATENT DOCUMENTS

2008/0100209 A1* 5/2008 Ito .................. H01L 51/5212
                                                            313/504
2008/0197778 A1* 8/2008 Kubota ............ H01L 27/3258
                                                             315/73
(Continued)

FOREIGN PATENT DOCUMENTS

EP     1 331 666 A2    7/2003
KR     100556369 B1    3/2006
(Continued)

*Primary Examiner* — Natalia A Gondarenko

(57) ABSTRACT

An electroluminescent display device includes a substrate, a bank for defining an emission area on the substrate, an emission layer in the emission area defined by the bank, an electrode on the emission layer and the bank, and a conductive layer on the electrode, wherein the electrode includes a first portion having a relatively small thickness, and a second portion having a relatively large thickness, and the conductive layer is in contact with the first portion of the electrode, and wherein the conductive layer is provided on the electrode, and more particularly, the conductive layer is provided in such a way the conductive layer is in contact with the relatively-thin first portion of the electrode so that it is possible to prevent problems related with a burning phenomenon or wiring disconnection in the first portion of the electrode.

23 Claims, 4 Drawing Sheets

(52) U.S. Cl.
CPC ...... *H01L 51/5271* (2013.01); *H01L 27/3246* (2013.01); *H01L 51/0005* (2013.01); *H01L 2251/5315* (2013.01)

(58) Field of Classification Search
USPC ..................................... 257/72, 88, E33.001
See application file for complete search history.

(56) References Cited

U.S. PATENT DOCUMENTS

| | | | |
|---|---|---|---|
| 2009/0096371 A1* | 4/2009 | Matsudate | H01L 27/3276 313/505 |
| 2009/0184636 A1 | 7/2009 | Cok | |
| 2013/0234121 A1* | 9/2013 | Sonoyama | H01L 51/5012 257/40 |
| 2015/0115251 A1 | 4/2015 | Jinta et al. | |
| 2016/0005798 A1* | 1/2016 | Akiyama | H01L 51/5012 257/72 |
| 2016/0248039 A1 | 8/2016 | Choung et al. | |
| 2017/0358770 A1* | 12/2017 | Maeda | H01L 27/3279 |

FOREIGN PATENT DOCUMENTS

| | | | | |
|---|---|---|---|---|
| KR | 20150001319 A | * | 1/2015 | ......... H01L 51/5228 |
| KR | 20150001319 A | | 1/2015 | |

\* cited by examiner

ELECTROLUMINESCENT DISPLAY DEVICE

CROSS-REFERENCE TO RELATED APPLICATION

This application claims the priority of Korean Patent Application No. 10-2017-0162464 filed on Nov. 30, 2017, which is hereby incorporated by reference in its entirety.

BACKGROUND

Field of the Disclosure

The present disclosure relates to an electroluminescent display device, and more particularly, to an electrode of an electroluminescent display device.

Description of the Background

An electroluminescent display device is provided in such a way that an emission layer is formed between two electrodes. As the emission layer emits light by an electric field between the two electrodes, an image is displayed on the electroluminescent display device.

The emission layer may be formed of an organic material which emits light when an exciton is produced by the combination of an electron and a hole, and the exciton falls to the ground state from the excited state, or may be formed of an inorganic material such as a quantum dot.

Hereinafter, a related art electroluminescent display device will be described with reference to the accompanying drawings.

FIG. 1 is a cross-sectional view illustrating a related art electroluminescent display device.

As shown in FIG. 1, the related art electroluminescent display device may include a substrate 10, a circuit device layer 20, a first electrode 30, a bank 40, an emission layer 50, and a second substrate 60.

The circuit device layer 20 is formed on the first substrate 10 and includes various signal lines, a thin film transistor, and a capacitor.

The first electrode 30 is formed on the circuit device layer 20. The first electrode 30 is patterned by each pixel and functions as an anode of the electroluminescent display device.

The bank 40 is formed in a matrix form, which is defined as an emission area.

The emission layer 50 is formed in the emission area defined by the bank 40.

The second electrode 60 is formed on the emission layer 50 and functions as a cathode of the electroluminescent display device. The second electrode 60 is formed on the bank layer 40 as well as the emission layer 50.

In the related art electroluminescent display device, a first portion 60a of the second electrode 60 formed on a lateral surface of the bank 40 is relatively thinner than a second portion 60b of the second electrode 60 formed on an upper surface of the bank 40 and a third portion 60c of the second electrode 60 formed on an upper surface of the emission layer 50.

In this case, the first portion 60a of the second electrode 60 formed on the lateral surface of the bank 40 is increased in its resistance, whereby a burning phenomenon may occur in the first portion 60a of the second electrode 60, that is, a wiring disconnection may occur. Especially, if the emission layer 50 is formed by an inkjet process, the burning phenomenon or wiring disconnection can be serious. That is, if the emission layer 50 is formed by the inkjet process, a large lateral angle (θ) of the bank 40 is advantageous in that it is capable of preventing the emission layer 50 formed in one emission area from permeating into another emission area. However, if the lateral angle (θ) of the bank 40 becomes large, the first portion 60a of the second electrode 60 formed on the lateral surface of the bank 40 becomes thinner. Thus, the aforementioned problem related with the burning phenomenon and wiring disconnection becomes serious in the first portion 60a.

SUMMARY

The present disclosure has been made in view of the above problems and is to provide an electroluminescent display device which is capable of preventing problems related with a burning phenomenon or wiring disconnection in a portion of an electrode formed on a lateral surface of a bank even though the bank has a large lateral angle.

In accordance with an aspect of the present disclosure, the above can be accomplished by the provision of an electroluminescent display device comprising a substrate, a first electrode provided on the substrate, a bank configured to cover an end of the first electrode and to define an emission area, an emission layer provided on the first electrode in the emission area defined by the bank, a second electrode provided on the emission layer and the bank, and a conductive layer provided on the second electrode while being in contact with the second electrode, wherein the second electrode includes a first portion provided on a lateral surface of the bank, a second portion provided on an upper surface of the bank, and a third portion provided on an upper surface of the emission layer, and the conductive layer includes a first portion provided on the first portion of the second electrode.

In accordance with another aspect of the present disclosure, there is provided an electroluminescent display device comprising a substrate including an active area, and a dummy area prepared in the periphery of the active area, a bank provided on the active area and the dummy area of the substrate and configured to define an emission area, an emission layer provided in the emission area defined by the bank, an electrode provided on the bank and the emission layer, and a conductive layer provided on the electrode while being in contact with the electrode, wherein a pattern of the conductive layer in the active area is different from a pattern of the conductive layer in the dummy area.

In accordance with a further aspect of the present disclosure, there is provided an electroluminescent display device comprising a substrate, a bank configured to define an emission area on the substrate, an emission layer provided in the emission area defined by the bank, an electrode provided on the emission layer and the bank, and a conductive layer provided on the electrode, wherein the electrode includes a first portion having a relatively small thickness, and a second portion having a relatively large thickness, and the conductive layer is in contact with the first portion of the electrode.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
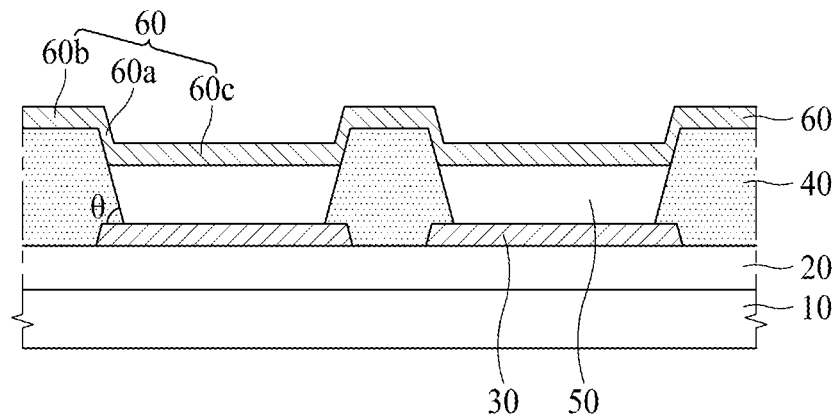
FIG. 1 is a cross-sectional view illustrating a related art electroluminescent display device.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

Hereinafter, an electroluminescent display device according to an aspect of the present disclosure will be described in detail with reference to the accompanying drawings.

Figure 2:
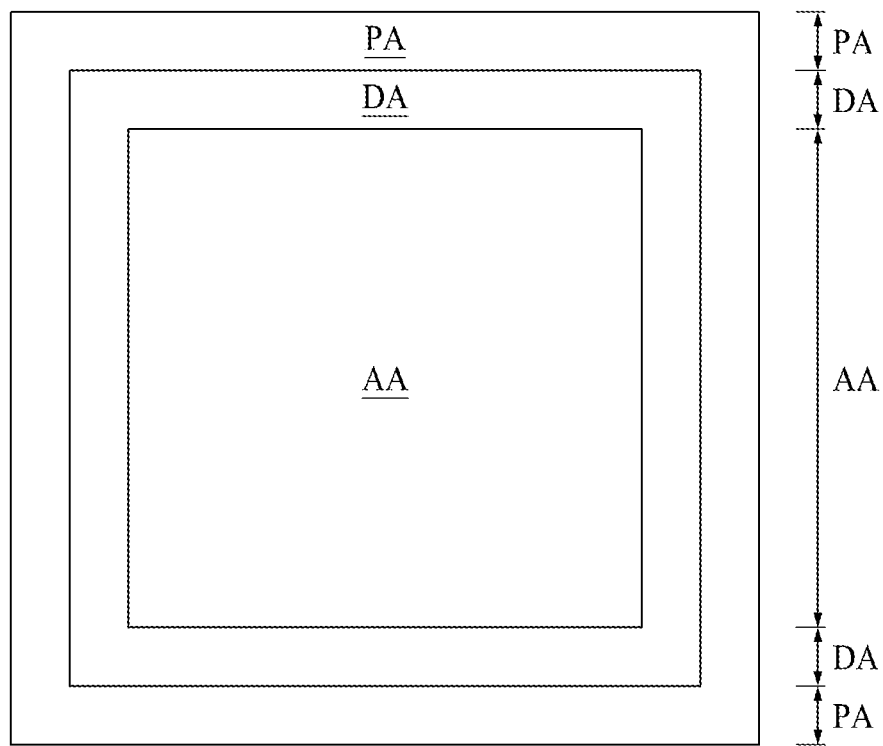
FIG. 2 is a plane view illustrating an electroluminescent display device according to one aspect of the present disclosure.

FIG. 2 is a plane view illustrating an electroluminescent display device according to one aspect of the present disclosure.

As shown in FIG. 2, the electroluminescent display device according to one aspect of the present disclosure may include an active area (AA), a dummy area (DA), and a pad area (PA).

The active area (AA) serves as a display area for displaying an image. A plurality of pixels is provided in the active area (AA).

In detail, signal lines such as a gate line, a data line, a power line, and a reference line are provided in the pixel of the active area (AA). Also, a plurality of thin film transistors for switching a transmission of a signal applied through the signal line are provided in the pixel of the active area (AA), and an emission device which is driven in accordance with the plurality of thin film transistors so as to emit light is provided in the pixel of the active area (AA).

The dummy area (DA) is provided to surround the active area (AA).

In detail, the dummy area (DA) is provided in left, right, lower and upper peripheral sides of the active area (AA). In the same manner as the active area (AA), a plurality of pixels may be provided in the dummy area (DA). However, the dummy area (DA) is not the display area for displaying an image, so that a structure of the pixel provided in the dummy area (DA) is different from a structure of the pixel provided in the active area (AA). For example, at least any one among the signal line, the thin film transistor and the emission device is not provided or incompletely provided in the pixel of the dummy area (DA), whereby light is not emitted from the pixel provided in the dummy area (DA).

The dummy area (DA) prevents a manufacturing error between a central portion of the active area (AA) and a peripheral portion of the active area (AA). This will be described in detail as follows.

A plurality of deposition processes and mask processes may be carried out in order to form the plurality of pixels in the active area (AA). The deposition process may be carried out so as to form an insulating layer, a metal layer or an organic layer through the use of physical deposition process, chemical deposition process, coating process or inkjet process. The mask process may be carried out so as to form a predetermined pattern having a predetermined shape in the insulating layer, metal layer or organic layer formed by the deposition process through the use of photolithography process.

If the plurality of deposition processes and mask processes are carried out for the active area (AA), the manufacturing error might occur between the central portion of the active area (AA) and the peripheral portion of the active area (AA). Accordingly, as the dummy area (DA) is provided in the periphery of the active area (AA), the manufacturing error may be generated in the dummy area (DA) instead of the active area (AA).

Especially, if an emission layer is formed inside the emission device by the use of inkjet process, dryness of the emission layer in the central portion of the substrate may be different from dryness of the emission layer in the peripheral portion of the substrate. In this case, if the dummy area (DA) is not provided, it may cause a problem related with non-uniformity of light emission between the central portion of the active area (AA) and the peripheral portion of the active area (AA).

Accordingly, the dummy area (DA) is provided in the periphery of the active area (AA). If the emission layer in the emission device is formed by the inkjet process, the dryness may be not uniform in the emission layer between the active area (AA) and the dummy area (DA). Even in this case, the dryness of the emission layer may be entirely uniform inside the active area (AA) because the dummy area (DA) is provided in the periphery of the active area (AA).

The pad area (PA) is provided in the periphery of the dummy area (DA).

A circuit driver such as a gate driver or a data driver may be disposed in the pad area (PA). The circuit driver may be provided in the periphery of at least one among left, right, lower and upper sides of the dummy area (DA). The circuit driver prepared in the pad area (PA) is connected with the circuit device inside the active area (AA) via the dummy area (DA).

Figure 3A:
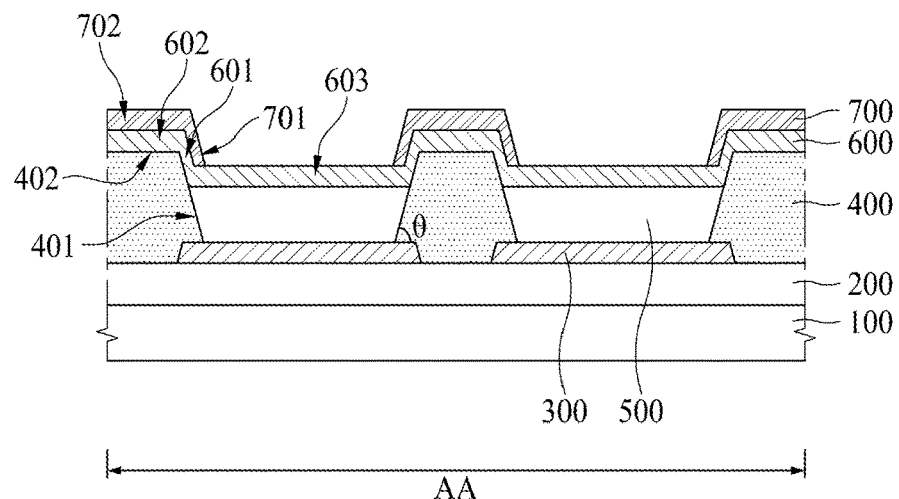
FIG. 3A is a cross-sectional view illustrating the electroluminescent display device according to one aspect of the present disclosure.
Figure 3B:
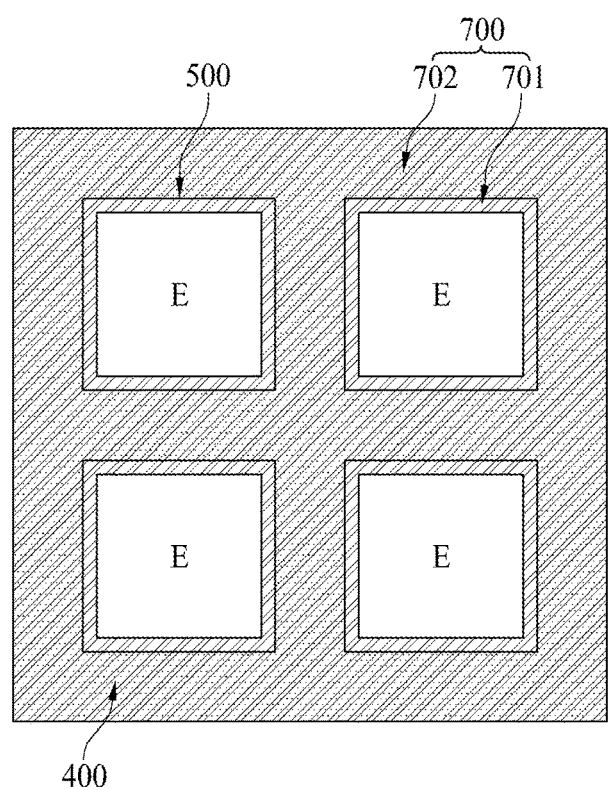
FIG. 3B is a plane view illustrating a plurality of pixels in the electroluminescent display device according to one aspect of the present disclosure.

FIG. 3A is a cross-sectional view illustrating the electroluminescent display device according to one aspect of the present disclosure, and FIG. 3B is a plane view illustrating the plurality of pixels in the electroluminescent display device according to one aspect of the present disclosure, which show the aforementioned active area (AA) of the electroluminescent display device shown in FIG. 2.

As shown in FIG. 3A, the electroluminescent display device according to one aspect of the present disclosure may include a substrate 100, a circuit device layer 200, a first electrode 300, a bank 400, an emission layer 500, a second electrode 600, and a conductive layer 700.

The first substrate 100 may be formed of a glass or plastic material, but not limited to this material. The first substrate 100 may be formed of a transparent material or an opaque material.

If the electroluminescent display device according to one aspect of the present disclosure is a top emission type where light emitted from the emission layer 500 advances toward an upper side, the first substrate 100 may be formed of the opaque material as well as the transparent material. Meanwhile, if the electroluminescent display device according to one aspect of the present disclosure is a bottom emission type where light emitted from the emission layer 500 advances toward a lower side, the first substrate 100 may be formed of only the transparent material.

The circuit device layer 200 is formed on the substrate 100.

In the circuit device layer 200, a circuit device including various signal lines, a thin film transistor and a capacitor is provided for each pixel. The signal lines may include a gate line, a data line, a power line and a reference line, and the thin film transistor may include a switching thin film transistor, a driving thin film transistor and a sensing thin film transistor.

According as the switching thin film transistor is switched in accordance with a gate signal supplied to the gate line, a data voltage provided from the data line is supplied to the driving thin film transistor by the use of switching thin film transistor.

According as the driving thin film transistor is switched in accordance with the data voltage supplied from the switching thin film transistor, a data current is generated by power supplied from the power line, and the generated data current is supplied to the first electrode 300.

The sensing thin film transistor senses a threshold voltage deviation of the driving thin film transistor, which causes a deterioration of picture quality. The sensing thin film transistor supplies a current of the driving thin film transistor to the reference line in response to a sensing control signal supplied from the gate line or an additional sensing line.

The capacitor maintains the data voltage supplied to the driving thin film transistor for one frame period. The capacitor is connected with each of gate and source terminals of the driving thin film transistor.

The first electrode 300 is formed on the circuit device layer 200. The circuit device layer comprises a thin film transistor.

The first electrode 300 is patterned by each pixel and the first electrode 300 functions as an anode of the electroluminescent display device. If the electroluminescent display device according to one aspect of the present disclosure is applied to a top emission type, the first electrode 300 may include a reflective material for upwardly reflecting the light emitted from the emission layer 500. In this case, the first electrode 300 may be formed in a deposition structure including the reflective material and transparent conductive material. If applying a bottom emission type, the first electrode 300 may be formed of the transparent conductive material.

The bank 400 is formed in the boundary line between the adjacent pixels. That is, the bank 400 is formed in a matrix configuration to define an emission area.

The bank 400 is formed on the circuit device layer 200. Especially, the bank 400 is provided to cover an end of the first electrode 300. Thus, the plurality of first electrodes 300 formed by each pixel may be insulated from each other by the bank 400.

The emission layer 500 is formed in the emission area defined by the bank 400. The emission layer 500 may emit red (R) light, green (G) light, or blue (B) light, but not limited to these colors. If needed, the emission layer 500 may emit white light. In this case, a color filter may be additionally provided in an advancing path of the light emitted from the emission layer 500.

The emission layer 500 may be patterned by each pixel in an evaporation method using a mask, or may be patterned by each pixel without a mask in a liquid process using an inkjet apparatus.

The emission layer 500 may include at least one organic layer among a hole injecting layer, a hole transporting layer, an organic emitting layer, an electron transporting layer, and an electron injecting layer.

The second electrode 600 is formed on the emission layer 500, wherein the second electrode 600 may function as a cathode of the electroluminescent display device.

The second electrode 600 may be formed on the bank 400 as well as the emission layer 500, wherein the second electrode 600 may be formed in the plurality of emission areas. Thus, the second electrode 600 may function as a common electrode for applying a common voltage to the plurality of pixels.

The second electrode 600 may include a first portion 601 formed on a lateral surface 401 of the bank 400, a second portion 602 formed on an upper surface 402 of the bank 400, and a third portion 603 formed on the emission layer 500. The first portion 601, the second portion 602 and the third portion 603 may be formed of the same material, and may be connected with each other so as to form one body. A lateral surface may be considered as any surface that is substantially oblique or perpendicular to the surface of the substrate.

According to a lateral angle (θ) of the bank 400, which is obtained by an upper surface of the first electrode 300 and the lateral surface 401 of the bank 400, the first portion 601 of the second electrode 600 formed on the lateral surface 401 of the bank 400 is changed in its thickness. For example, if the lateral angle (θ) of the bank 400 is increased, a thickness of the first portion 601 of the second electrode 600 becomes relatively smaller than a thickness in each of the second portion 602 and the third portion 603 of the second electrode 600. If the lateral angle (θ) of the bank 400 is decreased, a thickness of the first portion 601 of the second electrode 600 becomes similar to a thickness in each of the second portion 602 and the third portion 603 of the second electrode 600. Height is measured in a direction perpendicular to the surface of the substrate, and width is measured in a direction parallel with the surface of the substrate. The height (h1) of an emission layer is measured from the upper surface of the first electrode 300. The height of a second electrode 600 is also measured from the upper surface of the first electrode 300. The height of a bank 400 is measured from the upper surface of the planarization layer 270. The edge of the emission area may be considered to the upper surface of the emission area that is in direct contact with the bank. The upper surface of a feature is the surface of the feature furthest from the first substrate and parallel to the surface of the substrate.

In order to overcome a problem related with a burning phenomenon or wiring disconnection in the first portion 601 of the second electrode 600, the lateral angle (θ) of the bank 400 may be decreased. However, if the emission layer 500 is formed by the inkjet process, the large lateral angle (θ) is advantageous in that it is capable of preventing the emission layer 500 formed in one emission area from permeating into another emission area. Thus, it has limitations on the decrease of the lateral angle (θ) in the bank 400.

The first portion 601 has an inclined surface with respect to a horizontal surface, whereby the thickness of the first portion 601 is smaller than the thickness of the second portion 602 or the thickness of the third portion 603. Accordingly, a resistance of the first portion 601 is increased, whereby it may cause the problem related with the burning phenomenon or wiring disconnection. A horizontal surface may be considered as any surface that is substantially parallel to the surface of the substrate.

This problem related with the burning phenomenon or wiring disconnection may be generated due to the small thickness of the second electrode 600. Accordingly, if the entire thickness of the second electrode 600 is increased, the thickness of the first portion 601 of the second electrode 600 formed on the lateral surface 401 of the bank 400 is increased in some degree so that it is possible to lower a possibility of the problem related with the burning phenomenon or wiring disconnection caused by the increase of resistance in the first portion 601.

However, in case of the top emission type where the light emitted from the emission layer 500 advances upwardly, if the thickness of the second electrode 600 is increased, a light transmittance may be lowered. That is, it has limitations on the increase of thickness in the second electrode 600. Thus, the problem related with the burning phenomenon or wiring disconnection may be serious in the first portion 601 of the second electrode 600.

Meanwhile, in case of the bottom emission type where the light emitted from the emission layer 500 advances downwardly, even though the thickness of the second electrode 600 is increased, a light transmittance is not lowered. That is, it is possible to provide the second electrode 600 having the large thickness, and also to lower a possibility of the problem related with the burning phenomenon or wiring disconnection in the first portion 601 of the second electrode 600. Accordingly, the problem related with the burning phenomenon or wiring disconnection in the first portion 601 of the second electrode 600 may be more serious in the top emission type as compared with the bottom emission type.

The conductive layer 700 is formed on the second electrode 600 while being in contact with the second electrode 600 so that it is possible to prevent the problem related with the burning phenomenon or wiring disconnection in the first portion 601 of the second electrode 600.

The conductive layer 700 includes a first portion 701 and a second portion 702.

The first portion 701 of the conductive layer 700 is formed on the first portion 601 of the second electrode 600. Especially, the first portion 701 of the conductive layer 700 covers the first portion 601 of the second electrode 600. Thus, even though the first portion 601 of the second electrode 600 has the small thickness, the resistance is decreased in the first portion 601 of the second electrode 600 owing to the first portion 701 of the conductive layer 700 additionally provided on the first portion 601 of the second electrode 600, to thereby prevent the problem related with the burning phenomenon or wiring disconnection in the first portion 601 of the second electrode 600.

The second portion 702 of the conductive layer 700 is formed on the second portion 602 of the second electrode 600. Especially, the second portion 702 of the conductive layer 700 covers the second portion 602 of the second electrode 600. The second portion 702 of the conductive layer 700 is overlapped with the bank 400, and is not overlapped with the emission layer 500. Thus, the light transmittance is not lowered by the second portion 702 of the conductive layer 700, and the entire resistance of the second electrode 600 is rather lowered by the second portion 702 of the conductive layer 700.

An end of the first portion 701 of the conductive layer 700 is in contact with a contact point where the first portion 601 of the second electrodes 600 meets with the third portion 603 of the second electrode 600. If the first portion 701 of the conductive layer 700 extends along the third portion 603 of the second electrode 600, the light transmittance of the emission area may be lowered.

Due to the properties of manufacturing process, the thickness of the first portion 701 of the conductive layer 700 may be smaller than the thickness of the second portion 702 of the conductive layer 700.

The conductive layer 700 and the second electrode 600 may be formed of the same material. In this case, the second electrode 600 and the conductive layer 700 may be formed by the continuous manufacturing processes using the same apparatus. In case of the top emission type, the conductive layer 700 and the second electrode 600 may be formed of the same transparent conductive material, but not limited to this method.

A material for the conductive layer 700 may be different from a material for the second electrode 600. For example, the conductive layer 700 may be formed of a metal material with good conductivity. Also, the conductive layer 700 may be formed of a reflective material such as silver (Ag). In this case, light emitted from the emission layer 400 is reflected on the first portion 701 of the conductive layer 700, to thereby improve a light emission efficiency.

Meanwhile, although not shown, an encapsulation layer for preventing a moisture permeation into the emission layer 500 may be additionally formed on the conductive layer 700. The encapsulation layer may be formed of an inorganic insulating material, or may be formed in a deposition structure obtained by alternately depositing an inorganic insulating material and an organic insulating material, but not limited to these structures.

As shown in FIG. 3B, in case of the active area (AA), the bank 400 is formed in a matrix configuration, to thereby define an opening portion corresponding to a plurality of pixel regions. That is, the opening portion in which the bank 400 is not formed becomes the emission area (E), and the emission layer 500 is formed in the emission area (E).

Also, the conductive layer 700 is provided while being overlapped with the bank 400. The conductive layer 700 includes the second portion 702 overlapping the bank 400, and the first portion 701 overlapped with the end of the emission layer 500. From a top view, the conductive layer 700 is patterned in a shape which is identical to that of the bank 400. Unlike the bank 400, the conductive layer 700 is partially overlapped with the emission layer 500. If the overlap area between the emission layer 500 and the first portion 701 of the conductive layer 700 is increased in size, the light transmittance is decreased in the emission area (E). Thus, the overlap area may have a small size.

Figure 4:
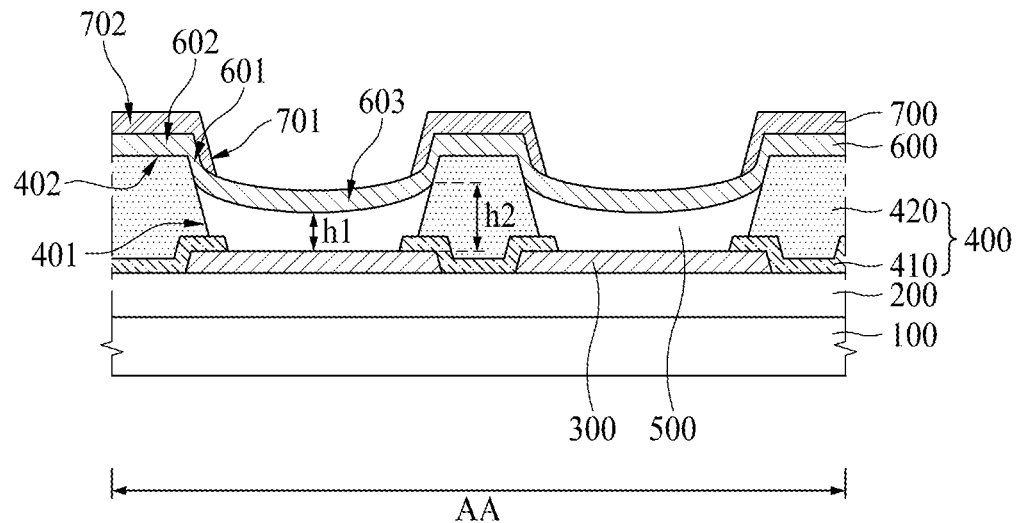
FIG. 4 is a cross-sectional view illustrating an electroluminescent display device according to another aspect of the present disclosure.

FIG. 4 is a cross-sectional view illustrating an electroluminescent display device according to another aspect of the present disclosure. Except for the structures of a bank 400 and an emission layer 500, the electroluminescent display device of FIG. 4 is in a similar structure to the electroluminescent display device of FIGS. 3A and 3B, whereby the same reference numbers will be used throughout the drawings to refer to the same parts. Hereinafter, only the different structure will be described in detail as follows.

As shown in FIG. 4, according to another aspect of the present disclosure, a bank 400 includes a first bank 410 and a second bank 420.

The first bank 410 covers an end of a first electrode 300, and the first bank 410 is formed on a circuit device layer 200. A thickness of the first bank 410 is relatively smaller than a thickness of the second bank 420, and a width of the first bank 410 is relatively larger than a width of the second bank 420. In the same manner as an emission layer 500, the first bank 410 having the above structure has a hydrophilic property. The first bank 410 having a hydrophilic property may be formed of an inorganic insulating material such as silicon oxide. Thus, when the emission layer 500 is formed by an inkjet process, a solution for forming the emission layer 500 may spread easily on the first bank 410.

The second bank 420 is formed on the first bank 410. The width of the second bank 420 is smaller than the width of the first bank 410. The second bank 420 may be obtained by coating a mixture solution of an organic insulating material having a hydrophilic property and a hydrophobic material such as fluorine, and patterning the coated mixture solution by the use of photolithography process. By the light irradiated for the photolithography process, the hydrophobic material such as fluorine may move to an upper portion of the second bank 420, whereby the upper portion of the second bank 420 has a hydrophobic property, and the remaining portions of the second bank 420 have a hydrophilic property. That is, the lower portion of the second bank 420 which is in contact with the first bank 410 has a hydrophilic property, and the upper portion of the second bank 420 has a hydrophobic property, but not limited to this structure. The entire portions of the second bank 420 may have a hydrophobic property.

Herein, spreadability of the solution for forming the emission layer 500 may be improved owing to the first bank 410 having a hydrophilic property and the lower portion of the second bank 420 having a hydrophilic property. Especially, as the first bank 410 has the relatively smaller thickness and the relatively larger width in comparison to the second bank 420, it is possible to prepare a 2-step structure of a hydrophilic property by the combination of the first bank 410 and second bank 420, whereby the solution for forming the emission layer 500 may easily spread to the left and right ends of the emission area.

Also, the upper portion of the second bank 420 having a hydrophobic property prevents the solution for forming the emission layer 500 from spreading to another neighboring emission area so that it is possible to prevent the emission layer 500 of one emission area from being mixed with the emission layer 500 of another neighboring emission area.

The first bank or the second bank may have a linear structure in the active area. A linear structure is a straight structure, i.e. the bank extends along a first direction and has a constant cross-section perpendicular to the first direction. The first bank may be formed as a mesh structure, which is a structure comprising a single layer that provides a plurality of regular apertures, typically being rectangular apertures arranged in a rectangular array, that define a regular pattern of emission areas in the active area. An electroluminescent display device may comprise a plurality of second banks of linear structure that are parallel to each other, and that are formed on top of a first bank having a mesh structure. An electroluminescent display device may comprises a plurality of second banks of linear structure that are parallel to each other, and that are formed on top of a plurality of first banks of linear structure that are parallel to each other and perpendicular to the linear structure of the second banks. A bank with a linear structure may only have such a structure in the active area. In some cases, a bank may be formed of a plurality of linear structures that are parallel to each other, and that are connected in the dummy area surrounding the active area, forming a snaking pattern.

The emission layer 500 is formed on the first electrode 300. The emission layer 500 may be formed by the inkjet process. If the emission layer 500 is formed by the inkjet process, a height (h1) of an upper end of the emission layer 500 at the center of the emission area after a drying process of drying the solution for forming the emission layer 500 is lower than a height (h2) of an upper end of the emission layer 500 at the end of the emission area. Especially, as shown in the drawings, according as the height of the emission layer 500 is gradually lowered from the end of the emission area to the center of the emission area, it is possible to realize a gradually-lowered profile shape.

Accordingly, a predetermined portion of a second electrode 600 formed on the emission layer 500 may have a profile corresponding to the profile of the emission layer 500. In this case, a thickness in a predetermined portion of the second electrode 600 formed on a lateral surface of the second bank 420 is relatively smaller than a thickness in the remaining portions of the second electrode 600. As described above, a conductive layer 700 may prevent a problem related with a burning phenomenon or wiring disconnection in a predetermined portion of the second electrode 600 formed on a lateral surface of the second bank 420.

Figure 5:
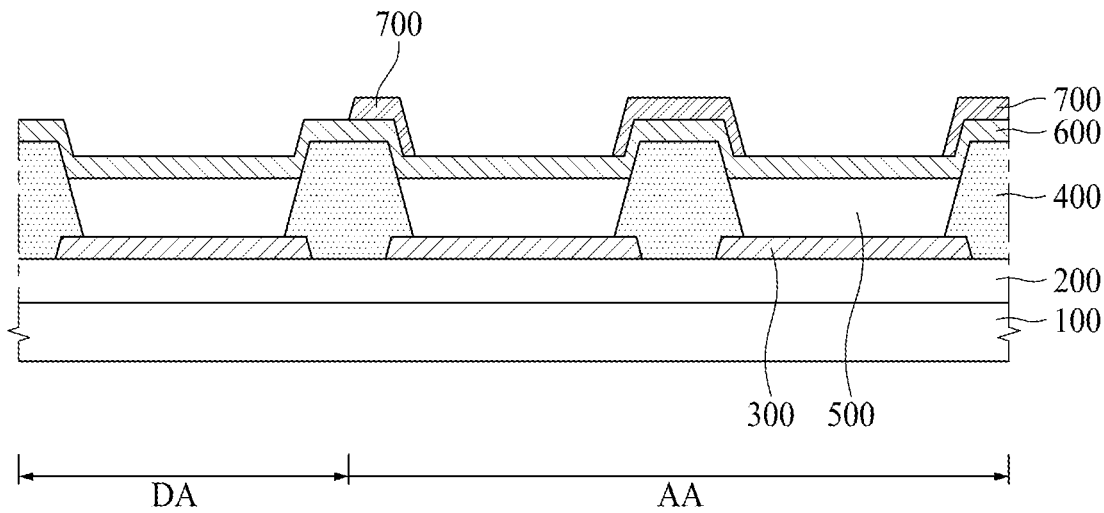
FIG. 5 is a cross-sectional view illustrating an electroluminescent display device according to another aspect of the present disclosure.

FIG. 5 is a cross-sectional view illustrating an electroluminescent display device according to another aspect of the present disclosure, which shows a dummy area (DA) and an active area (AA) shown in FIG. 2.

As shown in FIG. 5, a circuit device layer 200, a first electrode 300, a bank 400, an emission layer 500 and a second electrode 600 are formed on a substrate 100 in each of the active area (AA) and the dummy area (DA).

A structure for each of the circuit device layer 200, the first electrode 300, the bank 400, the emission layer 500 and the second substrate 600 formed in the active area (AA) is identical to the above structure of FIG. 3A or FIG. 4, whereby a detailed description for the same structures will be omitted.

The circuit device layer 200 formed in the dummy area (DA) may be identical in structure to the circuit device layer 200 formed in the active area (AA), and the circuit device layer 200 formed in the dummy area (DA) and the circuit device layer 200 formed in the active area (AA) may be manufactured by the same process, but not necessarily. That is, some of signal lines such as a gate line, a data line, a power line and a reference line may be not included in the circuit device layer 200 formed in the dummy area (DA), or some of a switching thin film transistor and a driving thin film transistor may be not included in the circuit device layer 200 formed in the dummy area (DA), whereby a light emission may be not generated in the dummy area (DA). If needed, the circuit device layer 200 formed in the dummy area (DA) may be configured incompletely so as not to operate any one of the switching thin film transistor and the driving thin film transistor.

The first electrode 300 formed in the dummy area (DA) may be identical in structure to the first electrode 300 formed in the active area (AA), and the first electrode 300 formed in the dummy area (DA) and the first electrode 300 formed in the active area (AA) may be manufactured by the same process. The first electrode 300 may be not formed in the dummy area (DA), whereby a light emission may be not generated in the dummy area (DA).

The emission layer 500 formed in the dummy area (DA) may be identical in structure to the emission layer 500 formed in the active area (AA), and the emission layer 500 formed in the dummy area (DA) and the emission layer 500 formed in the active area (AA) may be manufactured by the same process. Unlike the emission layer 500 formed in the active area (AA), some organic layers may be removed from the emission layer 500 formed in the dummy area (DA), whereby a light emission may be not generated in the dummy area (DA).

A conductive layer 700 is formed on the second electrode 600 provided in the active area (AA). As described above, the conductive layer 700 prevents a burning phenomenon or wiring disconnection in a predetermined portion of the second electrode 600 provided on a lateral surface of the bank 400. A detailed description for a structure of the conductive layer 700 will be omitted.

A pattern of the conductive layer 700 in the active area (AA) is different from a pattern of the conductive layer 700 in the dummy area (DA). In more detail, the conductive layer 700 is not formed in the dummy area (DA). In this specification, the pattern of the conductive layer 700 in the dummy area (DA) may be understood that the conductive layer 700 is not formed in the dummy area (DA).

An image is not displayed in the dummy area (DA). Thus, even though the problem is generated in the second electrode 600 provided in the dummy area (DA), it has no influence on a picture quality. Accordingly, the conductive layer 700 is formed only in the active area (AA), but not formed in the dummy area (DA).

Figure 6:
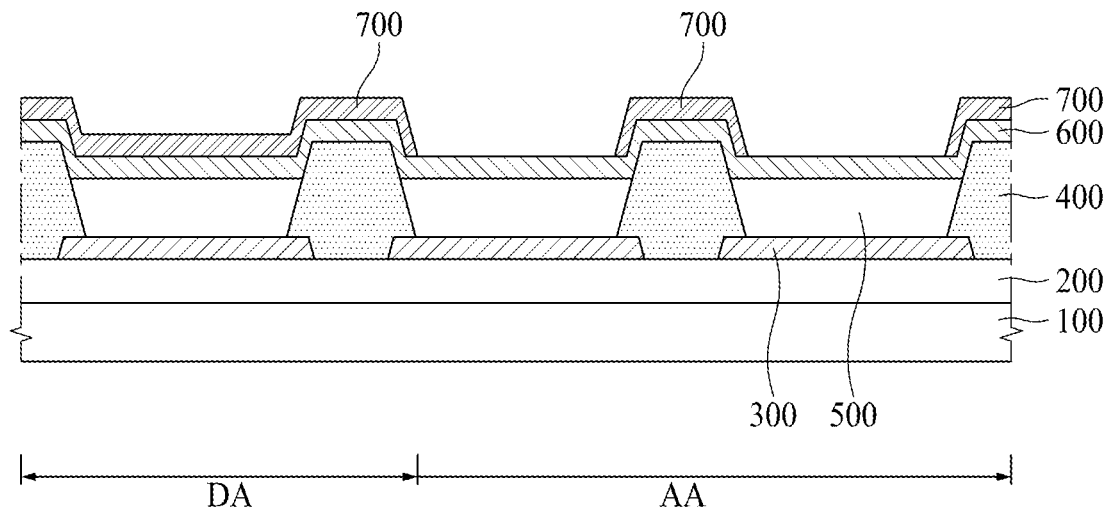
FIG. 6 is a cross-sectional view illustrating an electroluminescent display device according to another aspect of the present disclosure.

FIG. 6 is a cross-sectional view illustrating an electroluminescent display device according to another aspect of the present disclosure. Except for the structure of a conductive layer 700, the electroluminescent display device of FIG. 6 is in a similar structure to the electroluminescent display device of FIG. 5, whereby the same reference numbers will be used throughout the drawings to refer to the same parts. Hereinafter, only the different structure will be described in detail as follows.

As described above in FIG. 5, the conductive layer 700 is formed in the active area (AA), but not formed in the dummy area (DA). Meanwhile, referring to FIG. 6, the conductive layer 700 is formed not only in the active area (AA) but also in the dummy area (DA). However, a pattern of the conductive layer 700 formed in the active area (AA) is different from a pattern of the conductive layer 700 formed in the dummy area (DA).

The conductive layer 700 formed in the active area (AA) extends to an end of an emission area so as to minimize an overlap area with an emission layer 500, to thereby prevent lowering of light transmittance. Meanwhile, the conductive layer 700 formed in the dummy area (DA) is overlapped with the entire emission layer 500.

That is, an overlap area between the conductive layer 700 and the emission layer 500 in the dummy area (DA) is relatively larger than an overlap area between the conductive layer 700 and the emission layer 500 in the active area (AA). Also, a pattern of the conductive layer 700 in the dummy area (DA) is identical to a pattern of a second electrode 600 in the dummy area (DA).

An image is not displayed in the dummy area (DA), whereby a problem related with lowering of light transmittance is not generated in the dummy area (DA). Accordingly, in case of the structure shown in FIG. 6, an area of the conductive layer 700 is increased so as to lower an entire resistance of the second electrode 600.

Figure 7:
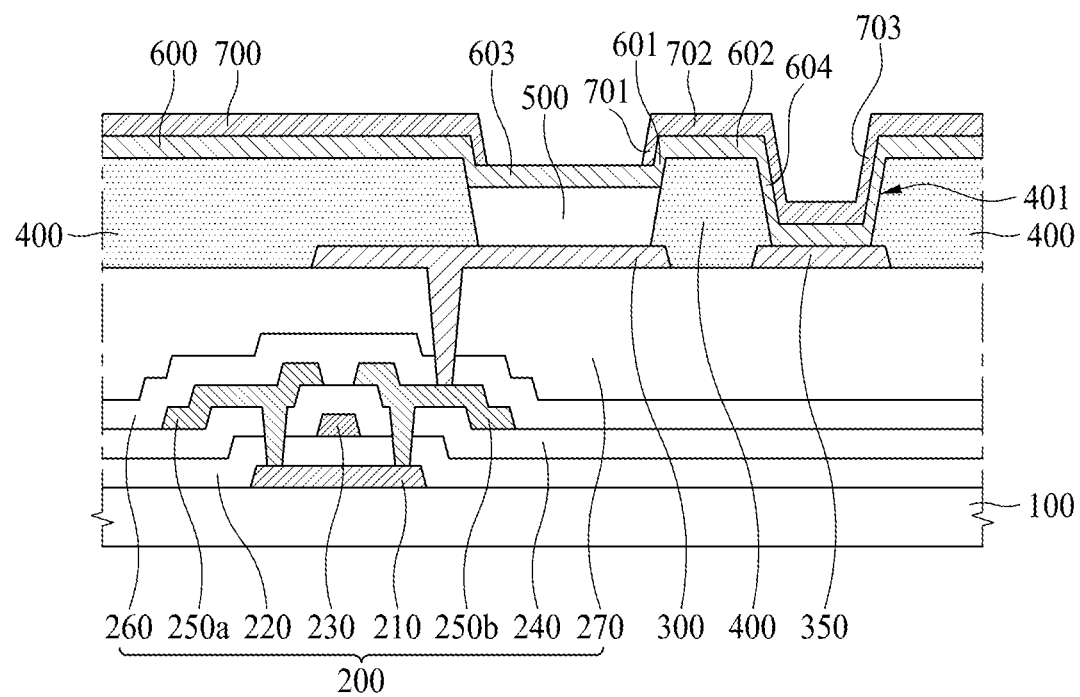
FIG. 7 is a cross-sectional view illustrating an electroluminescent display device according to yet another aspect of the present disclosure.

FIG. 7 is a cross-sectional view illustrating an electroluminescent display device according to another aspect of the present disclosure, which relates with an active area of a top emission type electroluminescent display device.

As shown in FIG. 7, the electroluminescent display device according to another aspect of the present disclosure may include a substrate 100, a circuit device layer 200, a first electrode 300, an auxiliary electrode 350, a bank 400, an emission layer 500, a second electrode 600, and a conductive layer 700.

The circuit device layer 200 may include an active layer 210, a gate insulating film 220, a gate electrode 230, an insulating interlayer 240, a source electrode 250a, a drain electrode 250b, a passivation layer 260, and a planarization layer 270.

The active layer 210 is formed on the substrate 110. The active layer 210 may be formed of a silicon-based semiconductor material or an oxide-based semiconductor material, but not limited to these materials. Although not shown, a light-shielding layer may be additionally provided between the substrate 100 and the active layer 210 so that it is possible to prevent light from being advanced to the active layer 210, to thereby prevent a deterioration of the active layer 210.

The gate insulating film 220 is formed on the active layer 210, to thereby insulate the active layer 210 and the gate electrode 230 from each other.

The gate electrode 230 is formed on the gate insulating film 220.

The insulating interlayer 240 is formed on the gate electrode 230, wherein the insulating interlayer 240 insulates the gate electrodes 230 from the source/drain electrode 250a/250b.

The source electrode 250a is provided at a predetermined interval from the drain electrode 250b, wherein the source electrode 250a and the drain electrode 250b confronting each other are provided on the insulating interlayer 240. The source electrode 250a and the drain electrode 250b are respectively connected with one end and the other end of the active layer 210 via contact holes provided in the insulating interlayer 240 and the gate insulating film 220.

The passivation layer 260 is provided on the source electrode 250a and the drain electrode 250b, to thereby protect a thin film transistor.

The planarization layer 270 is formed on the passivation layer 260, to thereby planarize a surface of the substrate 100.

Accordingly, the circuit device layer 200 includes the thin film transistor having the gate electrode 230, the active layer 210, the source electrode 250a, and the drain electrode 250b. FIG. 7 shows the thin film transistor having the top gate structure where the gate electrode 230 is provided above the active layer 210, but not limited to this type. For example, the thin film transistor having a bottom gate structure where the gate electrode 230 is provided below the active layer 210 may be provided in the circuit device layer 200.

The circuit device layer 200 may include a switching thin film transistor, a driving thin film transistor, a sensing thin film transistor, and a capacitor. The thin film transistor shown in FIG. 7 corresponds to the driving thin film transistor.

The electroluminescent display device of FIG. 7 corresponds to a top emission type. That is, even though the thin film transistor is disposed below the emission layer 500, the light emission is not influenced by the thin film transistor. Thus, the thin film transistor may be disposed below the emission layer 500.

The first electrode 300 is formed on the circuit device layer 200. The first electrode 300 is connected with the drain electrode 250b of the thin film transistor via the contact hole provided in the planarization layer 270 and the passivation layer 260. If needed, the first electrode 300 may be connected with the source electrode 250a of the thin film transistor via the contact hole provided in the planarization layer 270 and the passivation layer 260.

The auxiliary electrode 350 is formed on the circuit device layer 200. The auxiliary electrode 350 is provided at a predetermined interval from the first electrode 300. The auxiliary electrode 350 and the first electrode 300 may be formed of the same material, and may be manufactured by the same process.

The auxiliary electrode 350 is provided to lower a resistance of the second electrode 600. In case of the top emission type electroluminescent display device shown in FIG. 7, the second electrode 600 may be formed of a transparent conductive material. However, the transparent conductive material is disadvantageous in that it has a large resistance. Thus, the second electrode 600 of the transparent conductive material is connected with the auxiliary electrode 350, and the auxiliary electrode 350 is formed of a material having good conductivity, to thereby lower the resistance of the second electrode 600.

The bank 400 is provided on the planarization layer 270 while being configured to cover both ends of the first electrode 300. The contact hole 401 is provided in the bank 400, whereby the auxiliary electrode 350 is exposed via the contact hole 401. In this case, the bank 400 is formed to cover both ends of the auxiliary electrode 350. If the bank 400 is provided with a first bank 410 and a second bank 420, as described above in FIG. 4, a contact hole is provided in each of the first bank 410 and the second bank 420, whereby the auxiliary electrode 350 is exposed via the contact hole provided in each of the first bank 410 and the second bank 420.

The emission layer 500 is formed on the first electrode 300.

The second electrode 600 is formed on an entire surface of an active area. In detail, the second electrode 600 is formed on upper and lateral surfaces of the bank 400, and also formed on an upper surface of the emission layer 500. Also, the second electrode 600 extends along a lateral surface of the contact hole 401 prepared in the bank 400, and is then connected with the auxiliary electrode 350.

That is, the second electrode 600 includes a first portion 601 formed on the lateral surface of the bank 400, a second portion 602 formed on the upper surface of the bank 400, a third portion 603 formed on the upper surface of the emission layer 500, and a fourth portion 604 extending to the auxiliary electrode 350 along the lateral surface of the contact hole 401 prepared in the bank 400. The fourth portion 604 of the second electrode 600 extends to the inside of the contact hole 401.

Each of the first portion 601 and the fourth portion 604 of the second electrode 600 is relatively thinner than each of the second portion 602 and the third portion 603 of the second electrode 600. Accordingly, problems related with a burning phenomenon or a wiring disconnection may be generated in the first portion 601 and the fourth portion 604 of the second electrode 600.

The conductive layer 700 is formed on the second electrode 600. The conductive layer 700 includes a first portion 701 formed on the first portion 601 of the second electrode 600, a second portion 702 formed on the second portion 602 of the second electrode 600, and a third portion 703 formed on the fourth portion 604 of the second electrode 600. The third portion 703 of the conductive layer 700 extends to the inside of the contact hole 401.

The first portion 701 and the third portion 703 of the conductive layer 700 are respectively formed on the first portion 601 and the fourth portion 604 of the second electrode 600, whereby a resistance is decreased in the first portion 601 and the fourth portion 604 of the second electrode 600, to thereby prevent problems related with a burning phenomenon or a wiring disconnection.

According to the present disclosure, the conductive layer is provided on the electrode. And more particularly, the conductive layer is provided in such a way the conductive layer is in contact with the relatively-thin first portion of the electrode so that it is possible to prevent the problems related with a burning phenomenon or a wiring disconnection in the first portion of the electrode.

It will be apparent to those skilled in the art that the present disclosure described above is not limited by the above-described aspects and the accompanying drawings and that various substitutions, modifications, and variations can be made in the present disclosure without departing from the scope of the disclosure. Consequently, the scope of the present disclosure is defined by the accompanying claims. It is intended that all variations or modifications derived from the meaning, scope, and equivalent concept of the disclosure fall within the scope of the accompanying claims.

The various aspects described above can be combined to provide further aspects. Aspects of the present disclosure can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification, but should be construed to include the full scope to which such claims are entitled.

What is claimed is:

1. An electroluminescent display device including an active area and a dummy area surrounding the active area on a substrate, comprising:
   a first electrode provided on the substrate;
   a bank covering an end portion of the first electrode and defining an emission area;
   an emission layer provided on the first electrode in the emission area;
   a second electrode provided on the emission layer and the bank; and
   a conductive layer provided on the second electrode,
   wherein the second electrode includes a first portion disposed on a lateral surface of the bank, a second portion provided on an upper surface of the bank, and a third portion provided on an upper surface of the emission layer,
   wherein the conductive layer includes a first portion disposed on the first portion of the second electrode, and
   wherein the conductive layer is disposed only on the bank in the active area, and the conductive layer is disposed on the bank and the emission layer in the dummy area.

2. The electroluminescent display device according to claim 1, wherein the conductive layer further includes a second portion provided on the second portion of the second electrode.

3. The electroluminescent display device according to claim 2, further comprising an auxiliary electrode electrically connected with the second electrode through a contact hole in the bank.

4. The electroluminescent display device according to claim 3, wherein the second electrode further includes a fourth portion extending to the auxiliary electrode along a lateral surface of the contact hole, and the conductive layer includes a third portion disposed on the fourth portion of the second electrode.

5. The electroluminescent display device according to claim 1, wherein the conductive layer and the second electrode are formed of a same material.

6. The electroluminescent display device according to claim 1, wherein the conductive layer includes a reflective material.

7. The electroluminescent display device according to claim 1, wherein a height of the emission layer located at a center of the emission area is lower than a height of the emission layer at an edge of the emission area,
   wherein the bank includes a first bank and a second bank disposed on the first bank, and
   the first bank has a thickness smaller than the second bank and a width larger than the second bank.

8. The electroluminescent display device of claim 1, wherein the bank is disposed at the active area and the dummy area, and a pattern of the conductive layer in the active area is different from a pattern of the conductive layer in the dummy area.

9. The electroluminescent display device according to claim 8, wherein an overlapping area between the emission layer and the conductive layer in the dummy area is larger than an overlapping area between the emission layer and the conductive layer in the active area.

10. The electroluminescent display device according to claim 8, wherein the pattern of the conductive layer in the dummy area is identical to the pattern of the second electrode in the dummy area.

11. The electroluminescent display device according to claim 8, wherein the pattern of the conductive layer in the active area includes a first portion provided on the first portion of the second electrode.

12. The electroluminescent display device according to claim 11, wherein the pattern of the conductive layer in the active area includes a second portion provided on the second portion of the second electrode.

13. The electroluminescent display device according to claim 8, further comprising an auxiliary electrode electrically connected with the second electrode and provided below the bank,
   wherein the auxiliary electrode is exposed through a contact hole in the bank, the second electrode includes a fourth portion extending to the auxiliary electrode along a lateral surface of the contact hole, and the pattern of the conductive layer in the active area includes a third portion provided on the fourth portion of the second electrode.

14. An electroluminescent display device including an active area and a dummy area surrounding the active area on a substrate, comprising:
   a bank defining an emission area on the substrate;
   an emission layer provided in the emission area defined by the bank;
   a first electrode provided on the emission layer and the bank; and
   a conductive layer provided on the first electrode,
   wherein the first electrode includes a first portion having a first thickness, and a second portion having a second thickness, and the second thickness is greater than the first thickness,
   wherein the emission layer has a height at the center of the emission area is lower than a height of the emission layer at an edge of the emission area, and wherein the conductive layer is disposed only on the bank in the active area, and the conductive layer is disposed on the bank and the emission layer in the dummy area.

15. The electroluminescent display device according to claim 14, wherein the conductive layer is in contact with the first portion of the first electrode.

16. The electroluminescent display device according to claim 14, wherein the first portion of the first electrode is in direct contact with the bank.

17. The electroluminescent display device according to claim 14, wherein the first electrode has a profile matching a profile of the emission layer in the emission area.

18. The electroluminescent display device according to claim 14, wherein the conductive layer in the active area has a pattern different from that of the conductive layer in the dummy area.

19. The electroluminescent display device according to claim 14, further comprising a circuit device layer including a thin film transistor, wherein the bank is disposed on the circuit device layer.

20. The electroluminescent display device according to claim 14, further comprising an auxiliary electrode electrically connected with the first electrode and provided below the bank, wherein the bank includes a contact hole for exposing the auxiliary electrode;

the first electrode includes a first portion provided on a lateral surface of the bank, a second portion provided on an upper surface of the bank, a third portion provided on an upper surface of the emission layer, and a fourth portion extending to the auxiliary electrode along a lateral surface of the contact hole, and wherein the conductive layer is provided on the first portion, the second portion and the fourth portion of the first electrode.

21. The electroluminescent display device according to claim 14, wherein the first portion of the first electrode has a surface inclined with respect to a horizontal surface.

22. The electroluminescent display device according to claim 14, wherein the first portion of the electrode is provided on a lateral surface of the bank.

23. The electroluminescent display device according to claim 14, further comprising a second electrode to form an electric field with the first electrode, so that the emission layer emits light.

* * * * *